United States Patent
Yoo et al.

(10) Patent No.: US 8,284,599 B2
(45) Date of Patent: Oct. 9, 2012

(54) NONVOLATILE MEMORY DEVICE AND RELATED PROGRAMMING METHOD

(75) Inventors: Han Woong Yoo, Seoul (KR); Jae Hong Kim, Seoul (KR); Jun Jin Kong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 288 days.

(21) Appl. No.: 12/786,724

(22) Filed: May 25, 2010

(65) Prior Publication Data

US 2010/0321999 A1  Dec. 23, 2010

(30) Foreign Application Priority Data

Jun. 23, 2009  (KR) ........................ 10-2009-0056142

(51) Int. Cl.
*G11C 11/34* (2006.01)

(52) U.S. Cl. .......... 365/185.01; 365/185.12; 365/185.14

(58) Field of Classification Search .............. 365/185.01, 365/185.12, 235, 238.5, 185.14
See application file for complete search history.

(56) References Cited

U.S. PATENT DOCUMENTS

| 7,443,726 | B2 | 10/2008 | Guterman | |
|---|---|---|---|---|
| 2007/0028000 | A1 | 2/2007 | Ebbesen et al. | |
| 2008/0212367 | A1 | 9/2008 | Kim et al. | |
| 2008/0310226 | A1 * | 12/2008 | Kang et al. ............... | 365/185.03 |

FOREIGN PATENT DOCUMENTS

| JP | 2001035170 A | 2/2001 |
|---|---|---|
| KR | 1020060052627 A | 5/2006 |
| KR | 100816154 B1 | 3/2008 |
| KR | 1020090025631 A | 3/2009 |

* cited by examiner

*Primary Examiner* — Jason Lappas
(74) *Attorney, Agent, or Firm* — Volentine & Whitt, PLLC

(57) ABSTRACT

A method of programming a nonvolatile memory device comprises programming memory cells connected to a first wordline, programming memory cells connected to a second wordline, programming memory cells connected to a third line between the first wordline and the second wordline, and adjusting a threshold voltage of the memory cells connected to the first wordline to compensate for interference generated by the programming of the memory cells connected to the third wordline.

20 Claims, 14 Drawing Sheets

(a) SLC   (b) 2-bit MLC   (c) 3-bit MLC   (d) 4-bit MLC

Fig. 4
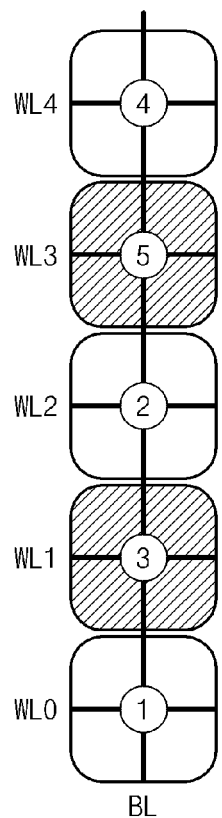
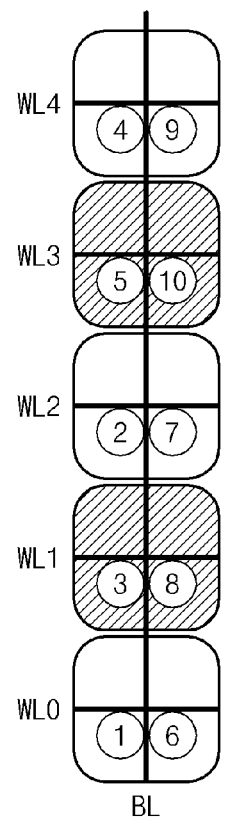
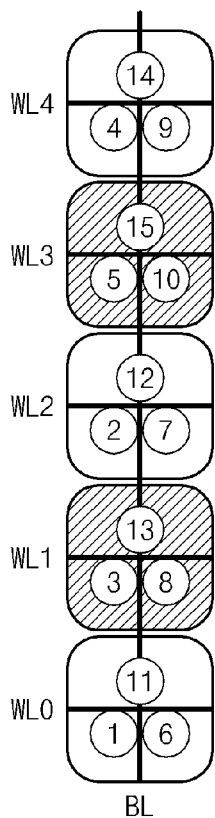
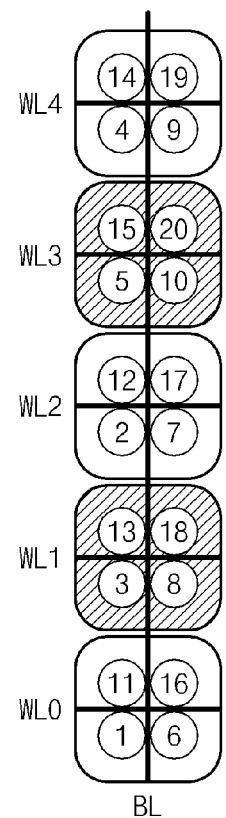
(a) SLC     (b) 2-bit MLC     (c) 3-bit MLC     (d) 4-bit MLC

Fig. 5
: Aggressor
: Victim
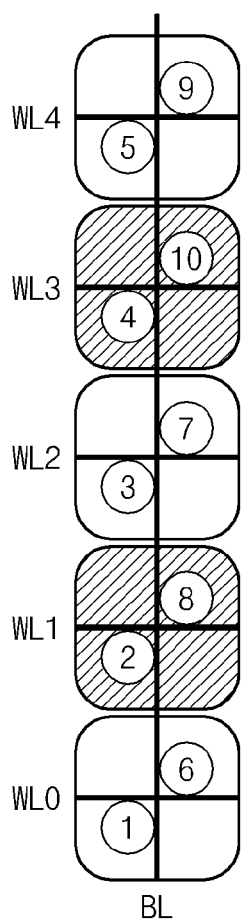
(a) 2-bit MLC
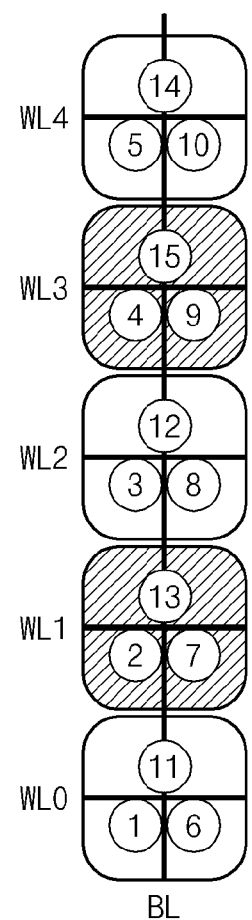
(b) 3-bit MLC
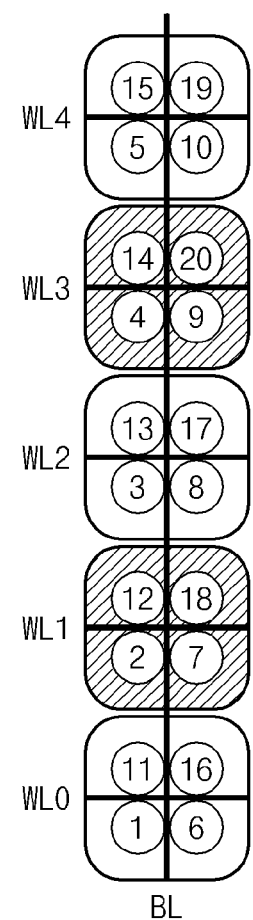
(c) 4-bit MLC (a) SLC  (b) 2-bit MLC  (c) 3-bit MLC Fig. 11
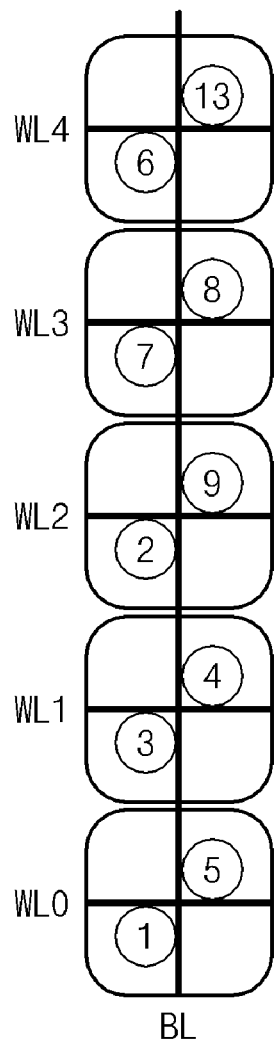
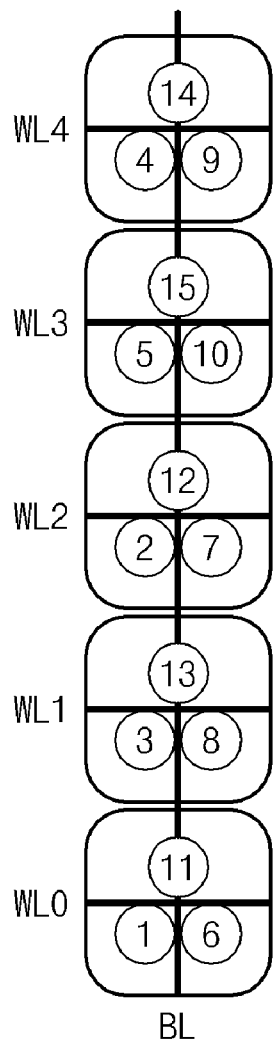
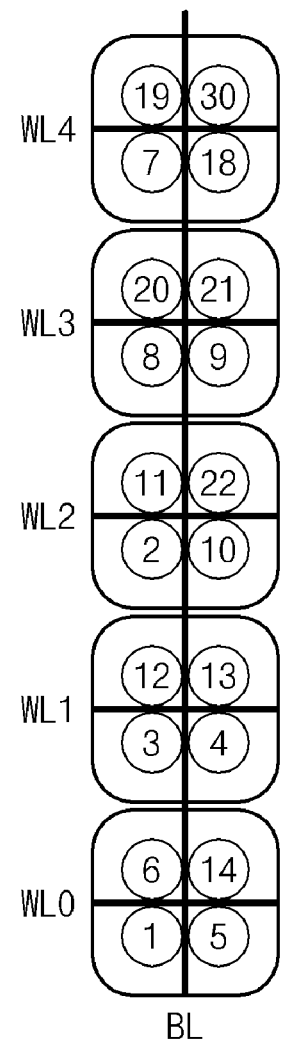
(a) 2-bit MLC   (b) 3-bit MLC   (c) 4-bit MLC

NONVOLATILE MEMORY DEVICE AND RELATED PROGRAMMING METHOD

CROSS-REFERENCE TO RELATED APPLICATIONS

This application claims priority under 35 U.S.C. §119 to Korean Patent Application No. 10-2009-0056142 filed on Jun. 23, 2009, the disclosure of which is hereby incorporated by reference in its entirety.

BACKGROUND

Embodiments of the inventive concept relate generally to semiconductor memory devices. More particularly, embodiments of the inventive concept relate to nonvolatile memory devices and related programming methods.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power. Because nonvolatile memories retain stored data when disconnected from power, they are often used to store data that must be retained even when devices are powered down.

Examples of volatile memory devices include dynamic random access memory (DRAM) and static random access memory (SRAM), and examples of nonvolatile memory devices include electrically erasable programmable read only memory (EEPROM), ferroelectric random access memory (FRAM), phase-change random access memory (PRAM), magnetoresistive random access memory (MRAM), and flash memory.

In recent years, there has been an increase in the number of devices employing nonvolatile memory devices. As examples, nonvolatile memory devices are being used increasingly in MP3 players, digital cameras, cellular phones, camcorders, flash cards, solid state drives (SSDs), to name but a few. In addition, there has also been an increase in the overall storage capacity of nonvolatile memory devices, resulting in a tremendous amount of nonvolatile data storage in use today.

Among nonvolatile memories, flash memory has become an increasingly popular choice for many devices, due at least to its relatively high integration density, performance, and durability. Flash memory is commonly used, for instance, in computers and memory cards, as well as many other devices.

Most flash memories are classified as either NOR type or NAND type based on memory cell characteristics and the arrangement of bitlines and wordlines. NOR flash memory comprises multiple cell transistors connected in parallel to a bitline; NOR flash memory stores data using channel hot electron injection and erases stored data using Fowler-Nordheim (F-N) tunneling. NAND flash memory comprises multiple cell transistors connected in series to a bitline; NAND flash memory stores and erases data using F-N tunneling.

Memory cells in a flash memory typically store or more bits of data each. A flash memory cell capable of storing one bit of data has two threshold voltage states—one state representing a logical "1" and another state representing a logical "0". A flash memory cell capable of storing two bits of data has four threshold voltage states representing logical "11", "10", "00", and "01". Similarly, a flash memory cell capable of storing three bits of data has eight threshold voltage states representing logical "111", "110", etc. Recently, various techniques have been studied for storing more than 4-bit data in one memory cell.

SUMMARY

Embodiments of the inventive concept provide programming methods for nonvolatile memory devices. Some of these methods are designed to concentrate interference between memory cells on specific cells and/or to reduce a load of processing procedures for interference compensation.

According to one embodiment of the inventive concept, a method of programming a nonvolatile memory device comprises programming memory cells connected to a first wordline, programming memory cells connected to a second wordline, programming memory cells connected to a third line disposed between the first wordline and the second wordline, and adjusting respective threshold voltages of the memory cells connected to the first wordline to compensate for interference caused by the programming of the memory cells connected to the third wordline.

In certain embodiments, the third wordline is disposed adjacent to the first wordline and the second wordline.

In certain embodiments, the method further comprises adjusting the respective threshold voltages of the memory cells connected to the first wordline is performed during programming of the memory cells connected to the third wordline.

In certain embodiments, the nonvolatile memory device is a multi-level cell flash memory device and the memory cells connected to the first and third wordlines store most significant bit data following the programming.

In certain embodiments, the nonvolatile memory device comprises a NOR flash memory device.

In certain embodiments, the nonvolatile memory device is a multi-level cell flash memory device and the memory cells connected to the first wordline are programmed with most significant bit data, and the memory cells connected to the third wordlines are programmed with most significant bit data after the memory cells connected to the first wordline.

In certain embodiments, the memory cells connected to the first wordline are programmed with least significant bit data and the most significant bit data in successive program operations of the nonvolatile memory device.

In certain embodiments, adjusting the respective threshold voltages of the memory cells connected to the first wordline comprises increasing the threshold voltages.

According to another embodiment of the inventive concept, a method of programming a multi-level cell nonvolatile memory device comprises programming a first page of data in memory cells connected to a first wordline of the nonvolatile memory device, programming a second page of data in memory cells connected to a second wordline of the nonvolatile memory device, and programming a third page of data in memory cells connected to a third wordline of the nonvolatile memory device between the first wordline and the second wordline. The third page of data is programmed after the first and second pages of data.

In certain embodiments, the method further comprises adjusting respective threshold voltages of the memory cells connected to the first wordline to compensate for interference produced by the programming of the third page of data.

In certain embodiments, the method further comprises programming a fourth page of data in the memory cells connected to the first wordline, programming a fifth page of data in the memory cells connected to the second wordline, and programming a sixth page of data in the memory cells connected to the third wordline. The fourth through sixth pages of data comprise least significant bit data and the first through third pages of data comprise most significant bit data.

In certain embodiments, the sixth page of data is programmed prior to at least one of the fourth and fifth pages of data.

In certain embodiments, the nonvolatile memory device comprises a NOR flash memory device.

In certain embodiments, the multi-level cell nonvolatile memory device is a four bit nonvolatile memory device.

According to another embodiment of the inventive concept, a method of programming a multi level cell nonvolatile memory device comprises programming a first page into memory cells connected to a first wordline, programming a second page into memory cells connected to a second wordline, programming a third page into memory cells connected to a third wordline between the first wordline and the second wordline, and programming a fourth page into memory cells connected to the third wordline. The third and fourth pages are programmed in the memory cells connected to the third wordline after the first and second pages are programmed in the memory cells connected to the respective first and second wordlines.

In certain embodiments, the method further comprises programming a fifth page into memory cells connected to the first wordline after programming the fourth page into the memory cells connected to the third wordline.

In certain embodiments, the fourth page and the fifth page comprise most significant bit data.

In certain embodiments, the method further comprises performing a tuning program procedure to adjust threshold voltages of the respective memory cells connected to the third wordline to compensate for interference due to the programming of the fifth page.

In certain embodiments, the method further comprises identifying memory cells connected to the first wordline as victim cells prior to the programming of the fifth page, and identifying the memory cells connected to the first wordline as aggressor cells following programming of the fifth page.

In certain embodiments, the nonvolatile memory device is a four-level cell NOR flash memory device.

BRIEF DESCRIPTION OF THE DRAWINGS

Embodiments of the inventive concept are described below with reference to the accompanying drawings. In the drawings, like reference numbers denote like features.

FIG. 4 is a conceptual diagram of a programming method for a nonvolatile memory device according to another embodiment of the inventive concept.

FIG. 5 is a conceptual diagram of a programming method for a nonvolatile memory device according to still another embodiment of the inventive concept.

FIG. 11 is a conceptual diagram illustrating a programming method for a nonvolatile memory device according to still another embodiment of the inventive concept.

DETAILED DESCRIPTION OF THE EMBODIMENTS

Selected embodiments of the inventive concept are described below with reference to the corresponding drawings. These embodiments are presented as teaching examples and should not be construed to limit the scope of the inventive concept.

In the description that follows, a NAND type flash memory device is presented as one example as a nonvolatile memory device to describe features and functions of certain embodiments. The inventive concept, however, is not limited to NAND type flash memory devices.

Figure 1:
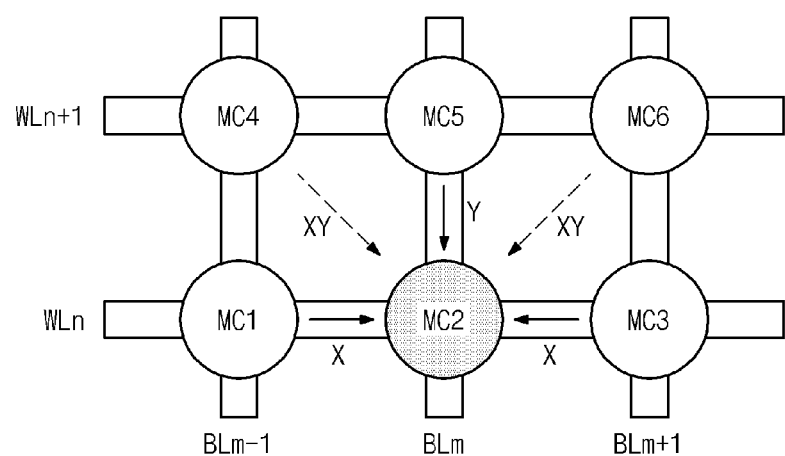
FIG. 1 is a schematic diagram illustrating a memory cell array of a nonvolatile memory.

FIG. 1 is a diagram illustrating a cell array of a nonvolatile memory. This diagram provides an example of interference that can occur between adjacent memory cells.

Referring to FIG. 1, during a program operation, a memory cell MC2 is affected by interference from adjacent memory cells MC1, MC3, MC4, MC5 and MC6. The interference causes a threshold voltage of memory cell MC2 to shift. The interference can take any of several forms, such as program disturbances or electrical coupling with the adjacent memory cells. The interference can cause memory cell MC2 to exhibit an erroneous logic state, creating errors in data read from the cell array. In general, any memory cell that causes interference in another memory cell is called an "aggressor cell", and a memory cell that experiences a threshold voltage shift due to such interference is called a "victim cell".

Electrical coupling and program disturbances are used as examples of phenomena that can shift the threshold voltage of a victim cell. The threshold voltages of memory cells, however, can shift in unintended ways due to other factors in addition to coupling or program disturbances. For example, the threshold voltages of memory cells can shift due to factors such as oxide layer deterioration over time, hot temperature stress (HTS), and program/erase cycle increases.

The threshold voltages of memory cells can also shift due to lateral charge spreading, where electric charges are transferred to adjacent memory cells based on certain device characteristic, such as floating gate characteristics of charge trap flash (CTF) memory devices. This type of threshold voltage shift is not limited to influence from adjacent memory cells. For example, threshold voltages can be influenced by memory cells connected to the same wordline or bitline, and they may shift due to a data recording method or data pattern. Accordingly, a threshold voltage shift of victim cell MC2 is not limited to specific causes. Additionally, feature characteristics of certain embodiments of the inventive concept may vary according to specific interference patterns or the intensity of interactions between aggressor and victim cells.

As indicated above, memory cells can experience unintended threshold voltage shifts due to interference from aggressor cells. The designation of a memory cell as an aggressor or victim cell, however, is a relative designation. Thus, a memory cell regarded as an aggressor cell in one program operation can be a victim cell in a subsequent program operation. Accordingly, a single cell may act as both a victim cell and an aggressor cell under different circumstances.

Figure 2:
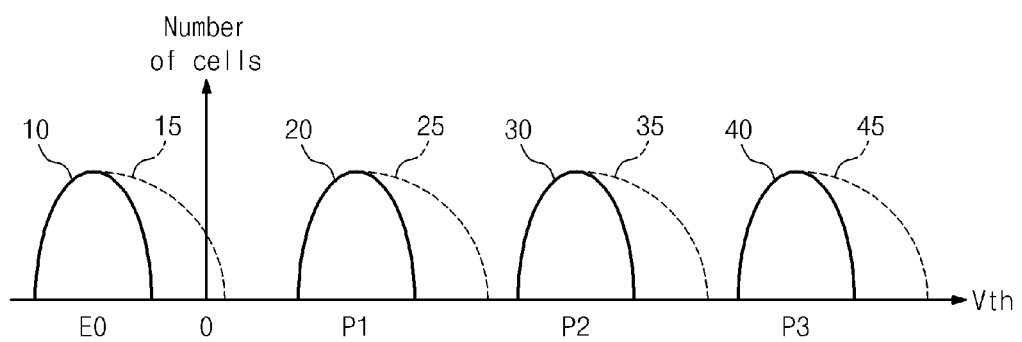
FIG. 2 is a threshold voltage diagram illustrating interference between aggressor cells and adjacent victim cells in a nonvolatile memory.

FIG. 2 is a threshold voltage diagram illustrating interference between victim cells and adjacent aggressor cells. More particularly, FIG. 2 illustrates a threshold voltage distribution of victim cells having threshold voltages that are shifted during subsequent programming of aggressor cells.

Referring to FIG. 2, an erase state E0 corresponds to data "11" and has a lowest threshold voltage distribution. Program states P1, P2, and P3 have higher threshold voltage distributions and correspond, respectively, to data "10", "00", and "01". In alternative embodiments, the correspondence between states and data can be modified. In addition, although a 2-bit multi-level cell (MLC) is illustrated as an example, the inventive concept is not limited to 2-bit MLCs. For instance, certain embodiments relate to nonvolatile memories having 3-bit MLCs, 4-bit MLCs, or even higher order MLCs.

The threshold voltage distributions corresponding to states E0, P1, P2 and P3 immediately after completion of a program operation are indicated by solid curves labeled 10, 20, 30, and 40, respectively. Where aggressor cells are programmed, the threshold voltages of victim cells shift to distributions indicated by dotted curves labeled 15, 25, 35 and 45. In particular, threshold voltages of victim cells in distribution 10 expand into distribution 15, and threshold voltage of victim cells in distributions 20, 30 and 40 expand into distributions 25, 35 and 45, respectively.

In certain embodiments, victim cells having threshold voltages in distributions 25, 35, and 45 are read in light of program states of aggressor cells, or they are restored to original distributions 20, 30 and 40 by additional data processing. For instance, in some embodiments, where an aggressor cell has a high threshold voltage or produces significant interference, a read voltage of a victim cell is adjusted to account for the interference.

In certain embodiments, compromised data in victim cells can be restored based on trends or patterns of interference. This restoration can be performed, for instance, using certain algorithms for compensating for the interference. The effectiveness of such algorithms for compensating for interference typically depends on accurate characterization of aggressor cells and victim cells and accurate understanding of any associated interference.

Figure 3:
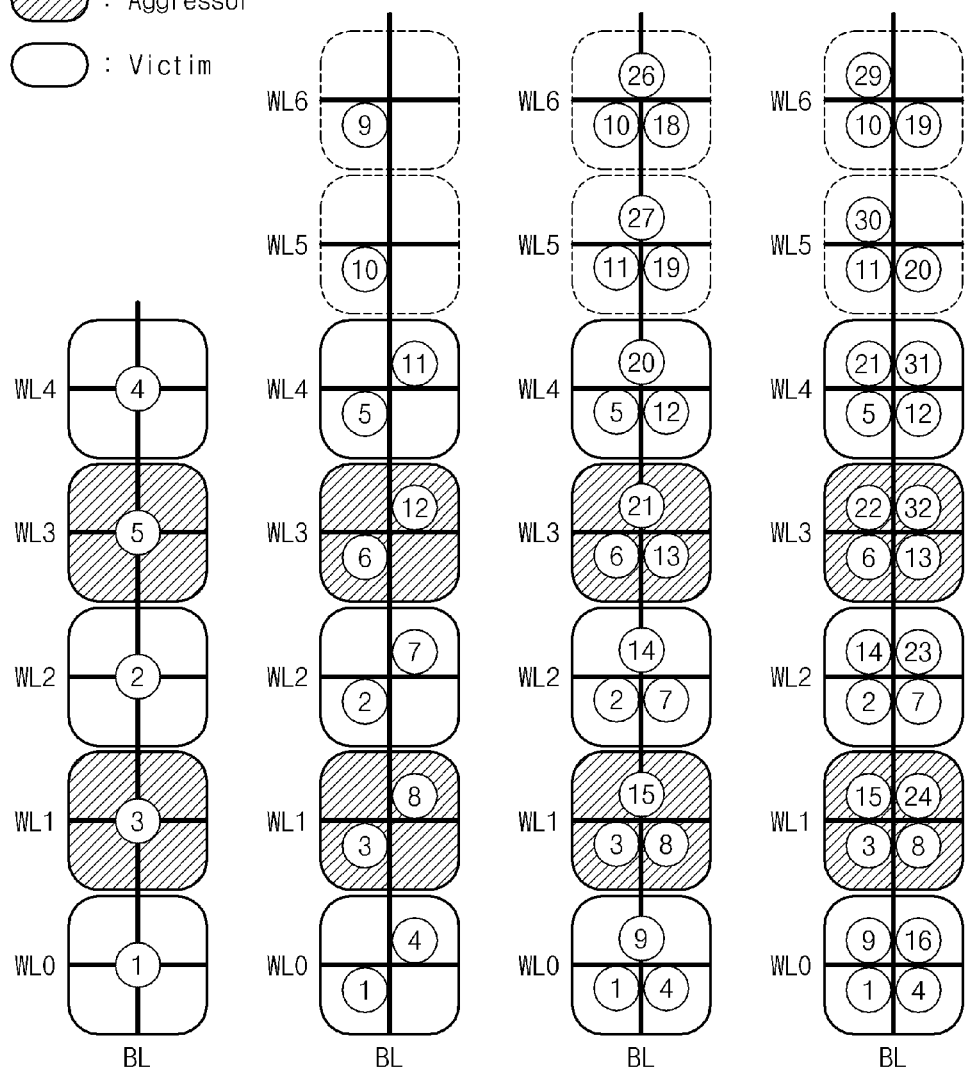
FIG. 3 is a conceptual diagram of a programming method for a nonvolatile memory device according to an embodiment of the inventive concept.

FIG. 3 is a conceptual diagram illustrating a programming method for a nonvolatile memory device according to an embodiment of the inventive concept. In FIG. 3, shading is used to distinguish between cells producing interference (i.e., aggressor cells) and cells receiving interference (i.e., victim cells). In particular, aggressor cells are indicated by shaded squares and victim cells are indicated by un-shaded squares.

FIG. 3 shows four different groups of memory cells labeled (a) through (d). Each group comprises cells capable of storing different numbers of bits. In particular, group (a) comprises single level cells (SLCs) each storing one bit of data; group (b) comprises 2-bit MLCs cells each storing two bits of data; group (c) comprises 3-bit MLCs cells each storing three bits of data; and group (d) comprises 4-bit MLCs cells each storing four bits of data. Each of groups (a) through (d) comprises memory cells connected to a common bitline BL and different wordlines WL1 through WLn.

In FIG. 3, the programming order of each group of memory cells (a) through (d) is indicated by circled numeric labels. For instance, in group (a), memory cells are programmed by first applying an appropriate wordline voltage to wordline WL0 (see, label "1"), then applying a required wordline voltage to wordline WL2 (see, label "2"), followed by wordline WL1 ("3"), wordline WL4 ("4"), and wordline WL3 ("5"). This sequence can be represented with the following notation: WL0→WL2→WL1→WL4→WL3. By applying the appropriate wordline voltages to wordlines WL0 through WL4 as described above, while also applying an appropriate bitline voltage to bitline BL, each of the memory cells in group (a) can be programmed to one of two states to store a single bit.

Although FIG. 3 shows only one bitline connected to each of groups (a) through (d), each of groups (a) through (d) could alternatively comprise a plurality of bitlines corresponding to a page of memory cells, and each of the memory cells connected to wordlines WL0 through WLn could be replaced with a page of memory cells. In other words, each of the numbers in FIG. 3 could represent a separate page of data. In such embodiments, programming of the pages can be performed in the order indicated by FIG. 3. For instance, in group (a), a first page "page1" connected to wordline WL0 can be programmed first, followed by a page "page2" connected to wordline WL2, followed by a page "page3" connected to wordline WL1, and so on.

Adjacent memory cells act as aggressor cells or victim cells based on the order in which a program operation is performed. That is, among the adjacent cells, a memory cell programmed after other memory cells is typically an aggressor cell. Examining the programming sequence of group (a), the memory cells connected to wordline WL1 are programmed later than the memory cells connected to wordline WL2 and wordline WL0. Accordingly, the memory cells connected to wordline WL1 act as aggressor cells about memory cells connected to wordlines WL2 and WL0. Similarly, the memory cells connected to wordline WL3 are programmed later than the memory cells connected to wordlines WL2 and WL4. Here, the memory cells connected to wordlines WL1 and WL3 are prevented from experiencing interference such as coupling or program disturbances due to the programming sequence. The memory cells connected to wordlines WL0, WL2, and WL4, however, experience interference due to the later programming of the memory cells connected to wordlines WL1 and WL3. Accordingly, a procedure for compensating for the interference is applied to only the victim cells, also referred to as interference-concentrated cells.

In group (b) memory cells connected to wordlines WL0 through WL6 are programmed in the illustrated order. In group (b), each square includes two numbers to indicate the programming of first order bits and second order bits in each memory cell or each page of memory cells. For instance, a first bit of a memory cell connected to wordline WL0 is programmed first, as indicated by the label "1", and a second bit of the memory cell is programmed later, as indicated by the label "4".

Programming proceeds in group (b) as indicated by the circled numbers, such that the memory cells connected to wordlines WL1 and WL3 are aggressor memory cells and the memory cells connected to wordlines WL0, WL2, and WL4 are victim memory cells.

In the programming sequence of group (b), memory cells connected to wordlines WL0, WL2 and WL4 receive least significant bit (LSB) programming before memory cells connected to adjacent wordlines. For instance, memory cells connected to wordline WL2 receive LSB programming before memory cells connected to adjacent wordlines WL1 and WL3. The memory cells connected to wordlines WL0, WL2 and WL4 also receive most significant bit (MSB) programming before memory cells connected to adjacent wordlines. For instance, memory cells connected to wordline WL2 receive MSB programming before memory cells connected to adjacent wordlines WL1 and WL3. Interference from adjacent cells is concentrated in the earlier programmed memory cells—in this example, the memory cells connected to wordlines WL0, WL2 and WL4. At the same time, interference is prevented from occurring in the memory cells connected to wordlines WL1 and WL3. Consequently, a procedure for compensating for interference can be applied to the memory cells experiencing interference, but omitted for other memory cells.

In group (c), like group (b), memory cells connected to wordlines WL0 through WL6 are programmed in an order indicated by circled numbers. In group (c), each square includes three numbers to indicate the programming of first order bits (e.g., LSB data), second order bits (e.g., central significant bit (CSB) data), and third order bits (e.g., MSB data) in each memory cell or each page of memory cells. As an example, a first bit of a memory connected to wordline WL0 is programmed first, as indicated by the label "1", a second bit of the memory cell is programmed later, as indicated by the label "4", and a third bit of the memory cell is programmed later, as indicated by the label "9".

Programming proceeds in group (c) as indicated by the circled numbers, such that the memory cells connected to wordlines WL1, WL3 and WL5 are aggressor memory cells and the memory cells connected to wordlines WL0, WL2, WL4 and WL6 are victim memory cells.

In the example programming sequence of group (c), memory cells connected to wordlines WL0, WL2, WL4 and WL6 receive LSB programming before memory cells connected to adjacent wordlines. For instance, memory cells connected to wordline WL2 receive LSB programming before memory cells connected to adjacent wordlines WL1, WL3 and WL5. The memory cells connected to wordlines WL0, WL2, WL4 and WL6 also receive CSB and MSB programming before memory cells connected to adjacent wordlines. For instance, memory cells connected to wordline WL2 receive CSB programming before memory cells connected to adjacent wordlines WL1 and WL3, and they also receive MSB programming before memory cells connected to adjacent wordlines WL1 and WL3. Accordingly, interference from adjacent memory cells is avoided in the memory cells connected to wordlines WL1, WL3 and WL5, and a procedure for compensating for interference can be applied to the memory cells connected to wordlines WL0, WL2, WL4 and WL6.

In group (d), like groups (b) and (c), memory cells connected to wordlines WL0 through WL6 are programmed in an order indicated by circled numbers. In group (d), each square includes four numbers to indicate the programming of first order bits (e.g., LSB data), second order bits (e.g., first CSB data), third order bits (e.g., second CSB data), and fourth order bits (e.g., MSB data) in each memory cell or each page of memory cells. For instance, a first bit of a memory cell connected to wordline WL0 is programmed first, as indicated by the label "1", a second bit of the memory cell is programmed later, as indicated by the label "4", a third bit of the memory cell is programmed later, as indicated by the label "9", and a fourth bit of the memory cell is programmed later, as indicated by the label "16".

Programming proceeds in group (d) as indicated by the circled numbers, such that the memory cells connected to wordlines WL1, WL3 and WL5 are aggressor memory cells and the memory cells connected to wordlines WL0, WL2, WL4 and WL6 are victim memory cells.

In the example programming sequence of group (d), memory cells connected to wordlines WL0, WL2, WL4 and WL6 receive LSB programming before memory cells connected to adjacent wordlines. For instance, memory cells connected to wordline WL2 receive LSB programming before memory cells connected to adjacent wordlines WL1, WL3 and WL5. The memory cells connected to wordlines WL0, WL2, WL4 and WL6 also receive CSB and MSB programming before memory cells connected to adjacent wordlines. Accordingly, interference from adjacent memory cells is avoided in the memory cells connected to wordlines WL1, WL3 and WL5, and a procedure for compensating for interference can be applied to the memory cells connected to wordlines WL0, WL2, WL4 and WL6.

As indicated by the above description, in the programming sequences of the groups illustrated in FIG. 3, MSB data is programmed into memory cells connected to wordlines WL1, WL3, and WL5 after MSB data is programmed into memory cells connected wordlines WL0, WL2, WL4, and WL6. Accordingly, interference is concentrated in the memory cells connected to wordlines WL0, WL2, WL4, and WL6. On the other hand, interference is prevented in the memory cells connected to wordlines WL1, WL3, and WL5 and threshold voltages of the memory cells connected to wordlines WL1, WL3, and WL5 are relatively stable. Because the interference is concentrated on the memory cells connected to wordlines WL0, WL2, WL4, and WL6, a procedure for compensating for the interference can be focused on those memory cells.

FIG. 4 is a conceptual diagram illustrating a programming method for a nonvolatile memory device according to another embodiment of the inventive concept. This diagram is similar to the diagram of FIG. 3 in that it illustrates four different groups of memory cells each comprising memory cells capable of storing different numbers of bits. In particular, a group (a) comprises memory cells storing one bit each, a group (b) comprises memory cells storing two bits each, a group (c) comprises memory cells storing three bits each, and a group (d) comprises memory cells storing four bits each.

In the method of FIG. 4, the memory cells storing different numbers of bits per cell are programmed using the same programming sequence for lower order bits and higher order bits. In particular, for each bit order (e.g., LSB, MSB, etc), memory cells connected to wordlines WL0 through WL4 are programmed using the following programming sequence: WL0→WL2→WL1→WL4→WL3. For instance, in group (a), a single bit of data is programmed in memory cells connected to wordline WL0 (see, label "1"), followed by memory cells connected to wordline WL2 (see, label "2"), wordline WL1 (see, label "3"), wordline WL4 (see, label "4"), and wordline WL3 (see, label "5").

In group (b), first order data (e.g., LSB data) is programmed using the same programming sequence as group (a), and then second order data (e.g., MSB data) is also programmed using the same programming sequence, as indicated by the order of labels "6" through "10".

In the example of group (b), memory cells connected to wordlines WL1 and WL3 are relatively free from the effects of interference such as coupling and program disturbances from adjacent memory cells. However, interference is typically present in memory cells connected to wordlines WL0, WL2, and WL4. Accordingly, a procedure for compensating for the interference can be applied to memory cells connected to wordlines WL0, WL2 and WL4, but not to those connected to wordlines WL1 and WL3.

In groups (c) and (d), the programming sequence WL0→WL2→WL1→WL4→WL3 is applied to first and second order data as in group (b). In addition, the same programming sequence is applied to third order data of 3-bit memory cells in group (c) and to third and fourth order data in 4-bit memory cells in group (d). Accordingly, as in the example of group (b), memory cells connected to wordlines WL1 and WL3 are relatively free from the effects of interference such as coupling and program disturbances from adjacent memory cells, but interference is typically present in memory cells connected to wordlines WL0, WL2, and WL4. Accordingly, a procedure for compensating for the interference can be applied to memory cells connected to wordlines WL0, WL2 and WL4, but not to those connected to wordlines WL1 and WL3.

FIG. 5 is a conceptual diagram illustrating a programming method for a nonvolatile memory device according to still another embodiment of the inventive concept. In the example of FIG. 5, the programming sequence WL0→WL2→WL1→WL4→WL3 is used only in MSB programming, while programming for lower order bits is performed in a programming sequence WL0→WL1→WL2→WL3→WL4. For instance, in a group (a), LSB data in 2-bit memory cells is programmed starting with memory cells connected to wordline WL0, followed by those connected to wordline WL1, wordline WL2, wordline WL3, and so on. Meanwhile, the MSB data of group (a) is programmed starting with memory cells connected to wordline WL0, followed by those connected to wordline WL2, wordline WL1, and so on.

In groups (b) and (c), lower order data is also programmed using the sequence WL0→WL1→WL2→WL3→WL4, while MSB data is programmed using the sequence WL0→WL2→WL1→WL4→WL3. As with the programming sequences illustrated in FIGS. 3 and 4, the sequences of FIG. 5 result in memory cells connected to wordlines WL1 and WL3 being substantially free from interference from aggressor cells. Thus, a procedure for compensating for interference can be omitted for the memory cells connected to wordlines WL1 and WL3.

Figure 6:
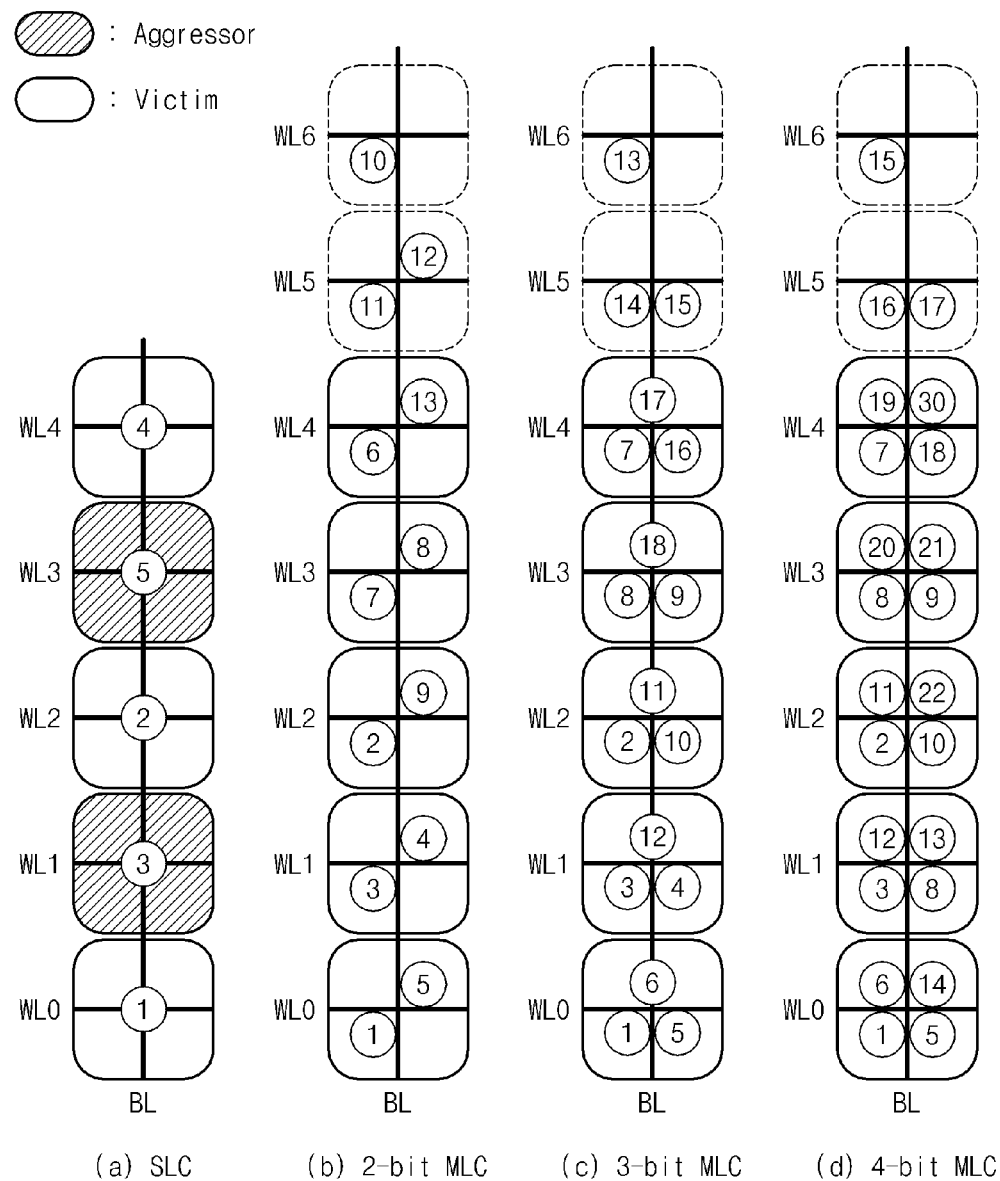
FIG. 6 is a conceptual diagram of a programming method for a nonvolatile memory device according to still another embodiment of the inventive concept.

FIG. 6 is a conceptual diagram illustrating a programming method for a nonvolatile memory device according to still another embodiment of the inventive concept. In FIG. 6, a memory cell group (a) has some aggressor cells and some victim cells as indicated by shading. Groups (b) through (d), however, are not strictly divided into aggressor cells and victim cells because the memory cells can act as aggressor cells or victim cells depending on the amount of programming that has been performed. For instance, certain memory cells may be aggressor cells after LSB programming, but victim cells after higher order programming. As an example, a page of memory cells connected to a certain wordline may be an aggressor page following LSB programming where the page is programmed with LSB data after an adjacent page of memory cells. The same page may become a victim page where second order programming (e.g., CSB or MSB programming) is performed on the page prior to second order programming of an adjacent page of memory cells.

In FIG. 6, group (a) is programmed using the same programming sequence as group (a) in FIGS. 3 and 4, i.e., WL0→WL2→WL1→WL4→WL3. Accordingly, in group (a), memory cells connected to wordlines WL1 and WL3 are aggressor cells and other memory cells are victim cells. Like FIGS. 3 through 5, the order of programming in FIG. 6 is indicated by circled numbers. Moreover, like FIGS. 3 through 5, higher numbers within each square indicate programming of higher order bits.

In group (b), 2-bit memory cells are programmed beginning with LSB data of memory cells connected to wordline WL0, followed by LSB data of memory cells connected to wordline WL2, and then LSB data of memory cells connected to wordline WL1. Thereafter, MSB data is programmed in the memory cells connected to wordline WL0, followed by the memory cells connected to wordline WL1. The programming proceeds as indicated by the circled numbers.

Following LSB programming, memory cells connected to wordlines WL0, WL2, WL4, and WL6 are victim cells, while the memory cells connected to wordlines WL1, WL3 and WL5 are aggressor cells. For instance, where only LSB data has been programmed in the memory cells connected to wordlines WL0, WL1 and WL2, as indicated by the circled numbers "1", "2", and "3", the memory cells connected to wordline WL1 may act as aggressor cells to shift the threshold voltages of the memory cells connected to wordlines WL0 and WL2. However, following MSB programming, the memory cells connected to wordline WL1 may be victim cells because they undergo MSB programming before the memory cells of wordlines WL0 and WL2.

The memory cells in group (c) are 3-bit memory cells and are programmed in an order indicated by the numbers shown in FIG. 6. For explanation purposes, it will be assumed that each number represents a page of data, with a circled "1" representing a first page "page 1", a circled "2" representing a second page "page 2", and so on.

In group (c), first through fifth pages 1 through 5 are programmed in the same order as in group (b). However, page 6 is programmed in memory cells connected to wordline WL0 as MSB data. Next, page 7 is programmed in memory cells connected to wordline WL4 as LSB data, and page 8 is programmed in memory cells connected to wordline WL3 as LSB data. Thereafter, page 9 is programmed in memory cells connected to wordline WL3 as CSB data, and page 10 is programmed into memory cells connected to wordline WL2 as CSB data. Page 11 is programmed in memory cells connected to wordline WL2 as MSB data, and page 12 is programmed in memory cells connected to wordline WL1 as MSB data. The memory cells in group (d) are 4-bit memory cells and are also programmed in an order indicated by the numbers in FIG. 6.

In the embodiment of FIG. 6, each memory cell can be a victim cell or an aggressor cell according to a number of pages that have been programmed. This occurs because interference patterns in the memory cells vary according to which pages have been programmed. The embodiment of FIG. 6 also potentially reduces the number of read operations performed during programming operations by sequentially programming certain pages in the same memory cells. For instance, third and fourth pages 3 and 4 are programmed in sequence, potentially eliminating a need to perform an initial read operation before programming page 4. Moreover, by programming pages 3 and 4 in the same set of memory cells, pages 3 and 4 do not interfere with each other.

In the embodiment of FIG. 6, aggressor and victim cells can be identified by referencing various parameters, such as a number of program or erase cycles that have been performed on the memory cells. Due to the programming sequence used in the embodiment of FIG. 6, certain memory cells can be programmed without performing an initial read operation due to the alternation of memory cells between victim cells and aggressor cells.

Figure 7:
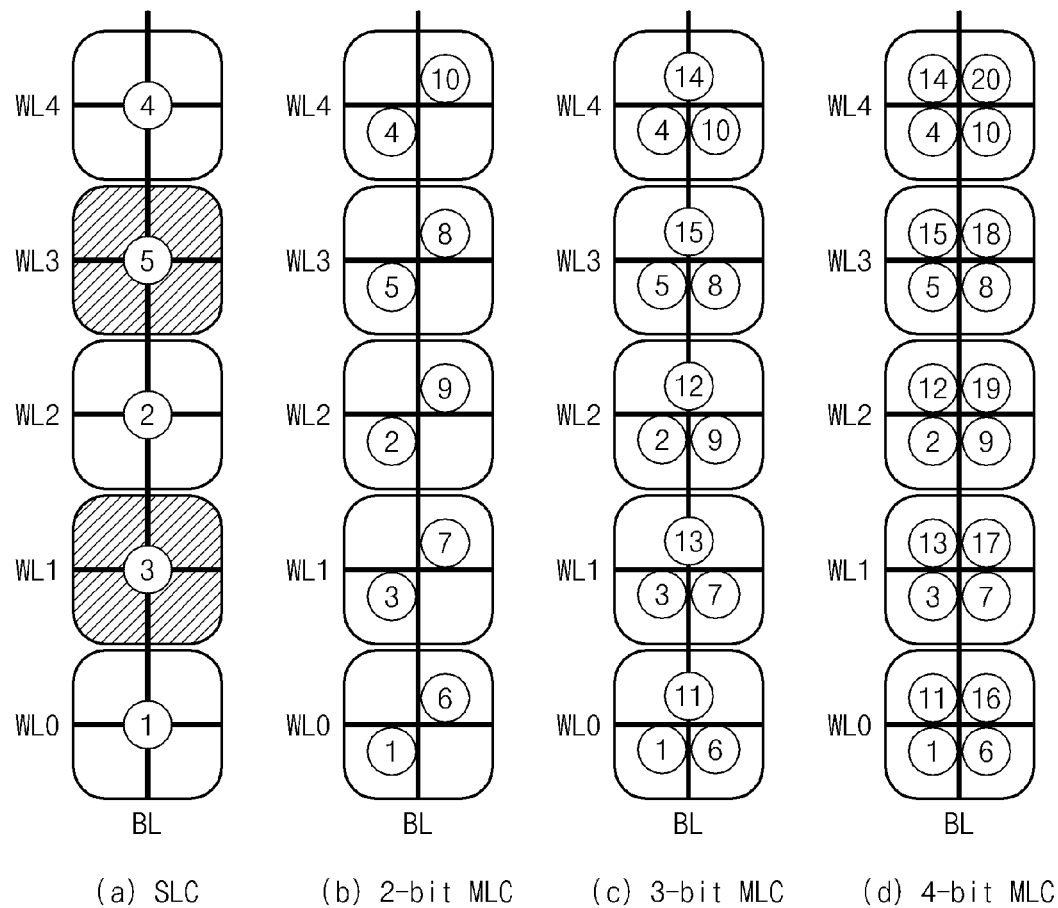
FIG. 7 is a conceptual diagram of a programming method for a nonvolatile memory device according to still another embodiment of the inventive concept.

FIG. 7 is a conceptual diagram illustrating a programming method for a nonvolatile memory device according to still another embodiment of the inventive concept. Like FIGS. 3 through 6, programming sequences in FIG. 7 are indicated by circled numbers. For explanation purposes, it will be assumed that each circled number corresponds to a page of data programmed in memory cells connected to a corresponding wordline. Within each square, higher numbers indicate higher order pages of data. In the embodiment of FIG. 7, memory cells connected to certain wordlines become aggressor memory cells or victim memory cells according to the number of programmed bits.

In FIG. 7, a group (a) comprises one-bit memory cells programmed in the same order as in FIG. 6 above.

In FIG. 7, a group (b) comprises 2-bit memory cells programmed in a sequence beginning with LSB programming following the same sequence as in FIG. 6, followed by MSB programming. In the MSB programming, a page 6 is programmed in memory cells connected to wordline WL0 and a page 7 is programmed in memory cells connected to wordline WL1. Thereafter, a page 8 is programmed into memory cells connected to wordline WL3, and a page 9 is programmed into memory cells connected to wordline WL2. A page 10 is then programmed in memory cells connected to wordline WL4. In group (b), after the LSB programming is completed, interference is concentrated on memory cells connected to wordlines WL0, WL2, and WL4, but after MSB programming, interference is concentrated on memory cells connected to wordlines WL1 and WL3.

In FIG. 7, a group (c) comprises 3-bit memory cells where the first and second order bits are programmed in the same sequence as the LSB and MSB programming of group (b), followed by programming of third order bits (MSB data for the 3-bit memory cells). In the MSB programming of group (c), a page 11 is programmed into memory cells connected to wordline WL0, and a page 12 is programmed into memory cells connected to wordline WL2. Thereafter, a page 13 is programmed in memory cells connected to wordline WL1, and a page 14 is programmed into memory cells connected to wordline WL4. Finally, a page 15 is programmed in memory cells connected to wordline WL3. In group (c), interference is concentrated on memory cells connected to wordlines WL0, WL2, and WL4 following LSB programming and MSB programming, and interference is concentrated on memory cells connected to wordlines WL1 and WL3 following CSB programming.

In FIG. 7, a group (d) comprises 4-bit memory cells where first through third order bits are programmed in the same sequence as the first through third order bits in group (c), followed by MSB programming. The MSB programming is then performed on group (d) such that interference is concentrated on wordlines WL1 and WL3 following MSB programming. Accordingly, in group (d), aggressor cells become victim cells depending on the number of pages that have been programmed.

In the programming sequences of FIG. 7, memory cells alternate between aggressor cells and victim cells depending on how many pages of data have been programmed. As further pages are programmed, adjacent memory cells exhibit alternating interference patterns, which can allow the interference to be managed in a regular way.

Figure 8:
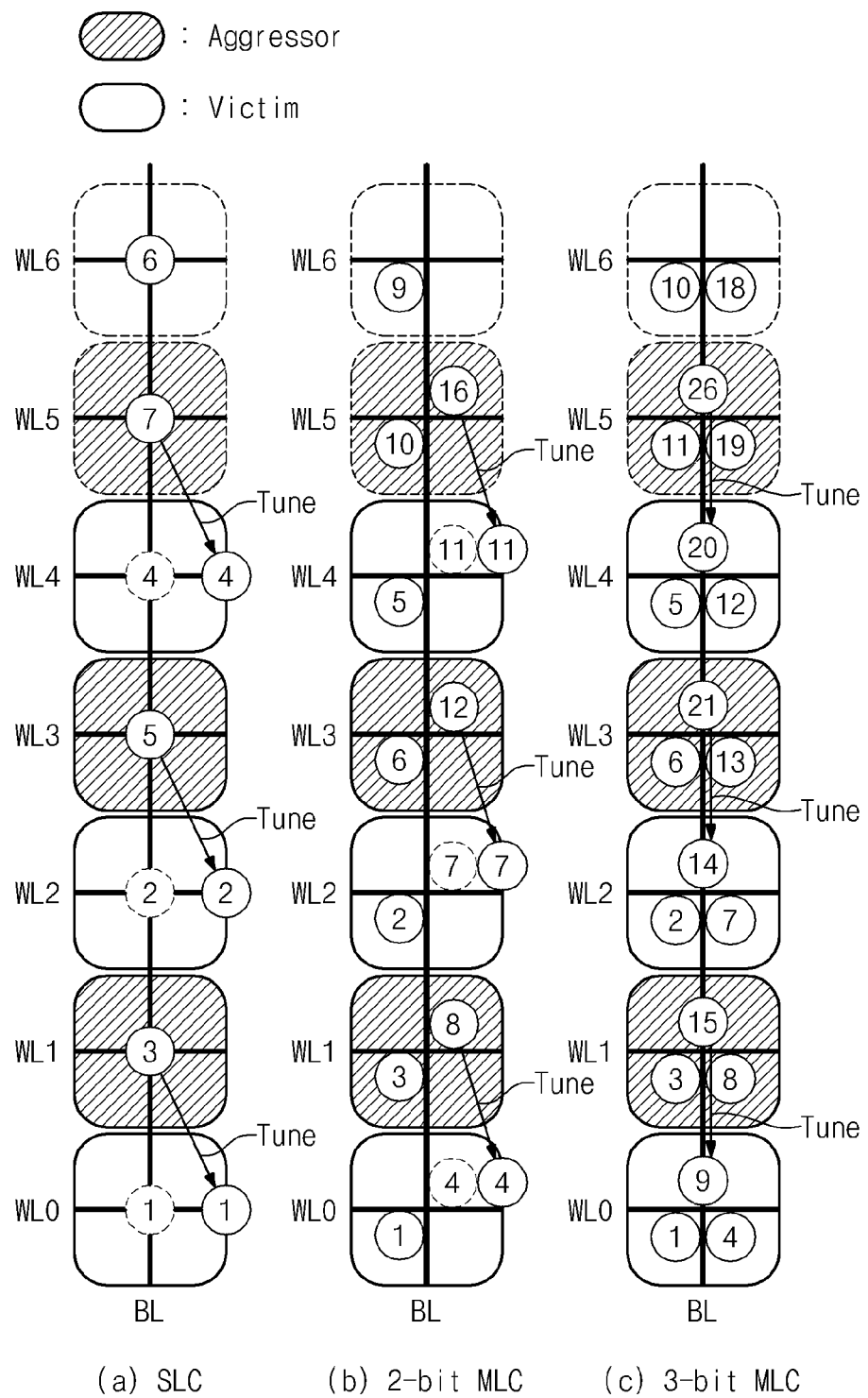
FIG. 8 is a conceptual diagram of a programming method for a nonvolatile memory device according to still another embodiment of the inventive concept.

FIG. 8 is a conceptual diagram illustrating a programming method for a nonvolatile memory device according to still another embodiment of the inventive concept. In the embodiment of FIG. 8, the programming method concentrates interference and compensates for the interference after aggressor cells are programmed. Like FIGS. 3 through 7, FIG. 8 illustrates programming of different groups (a) through (c) comprising memory cells storing different levels of data.

In group (a), pages of single level cells are programmed according to a programming sequence WL0→WL2→WL1→WL4→WL3. Following the programming, interference is concentrated on the memory cells connected to wordlines WL0, WL2, and WL4. Thereafter, a tuning program procedure is performed on the memory cells where interference is concentrated. In FIG. 8, the tuning procedure is indicated by arrows pointing to pages 1, 2 and 4 connected to wordlines WL0, WL2, and WL4. The tuning program procedure, which is explained further with reference to FIG. 9, adjusts the threshold voltages of memory cells where interference is concentrated, as indicated by the shift in the numbers 1, 2, and 4. The tuning program procedure for pages 1, 2 and 4 can be performed either during or after programming of aggressor cells corresponding to pages 3, 5 and 7, respectively.

In group (b), LSB and MSB programming are performed on two-bit memory cells using a programming sequence indicated by the circled numbers. Thereafter (or concurrent with MSB programming of aggressor cells), the tuning program procedure is performed on pages 4, 7, and 11 to compensate for interference caused by adjacent aggressor cells.

In group (c), LSB, CSB, and MSB programming are performed on 3-bit memory cells using a programming sequence indicated by the circled numbers. Thereafter (or concurrent with MSB programming of aggressor cells), the tuning program procedure is performed on pages 9, 14, and 20 to compensate for interference caused by adjacent aggressor cells. This is typically accomplished by narrowing the threshold voltage distributions of pages 9, 14, and 20. By performing the tuning program procedure, potential errors can be eliminated from pages 9, 14, and 20. Although not illustrated in FIG. 8, the tuning program procedure may also be performed in memory cells storing 4-bit data.

Figure 9:
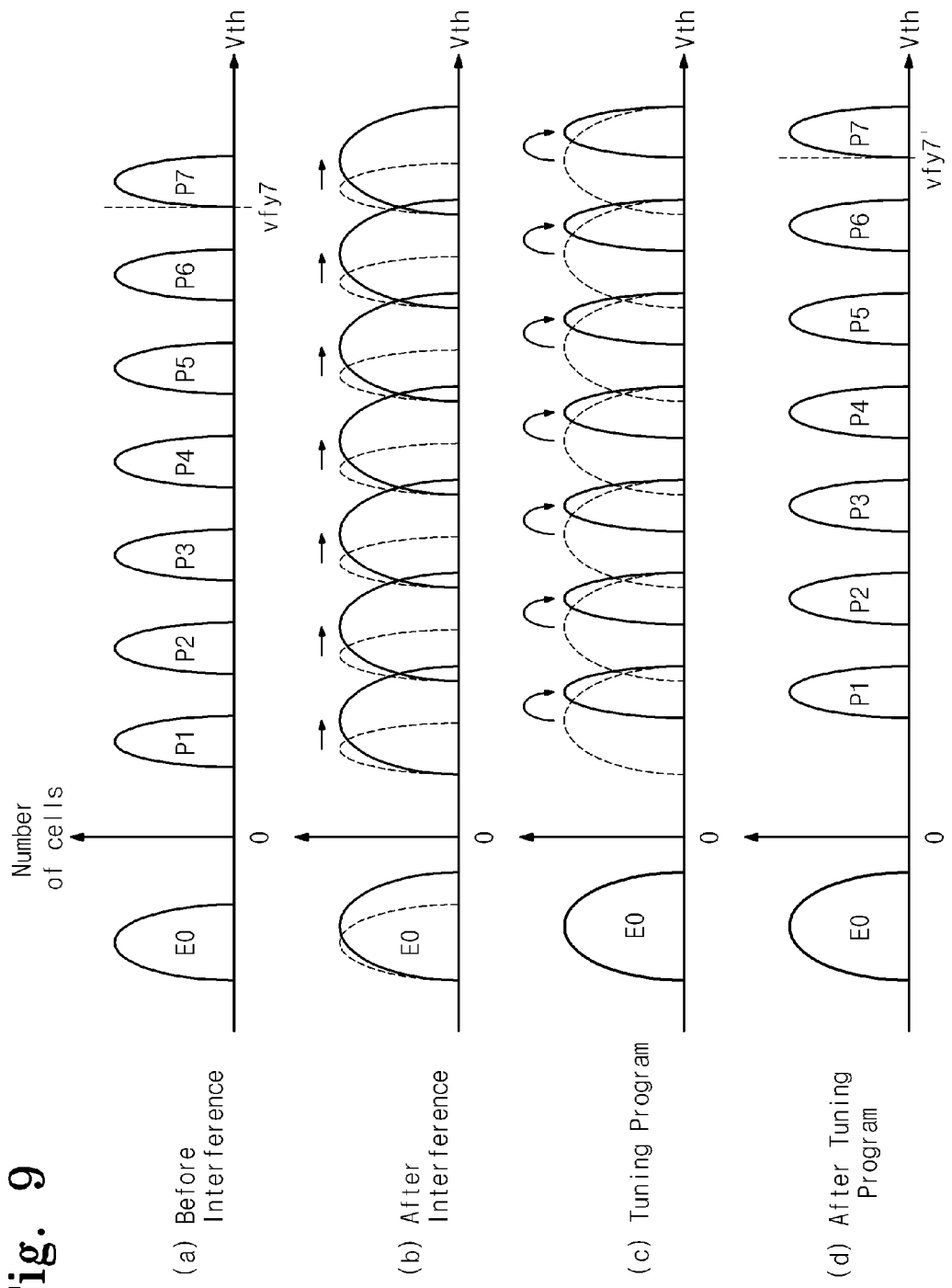
FIG. 9 is a threshold voltage diagram illustrating a tuning program procedure for memory cells connected to interference-concentrated victim wordlines.

FIG. 9 is a threshold voltage diagram illustrating a tuning program procedure for memory cells connected to interference-concentrated victim wordlines. In the example of FIG. 9, the tuning program procedure restores threshold voltage distributions of memory cells affected by interference.

In FIG. 9, a first graph (a) shows threshold voltage distributions of 3-bit memory cells prior to interference. In other words, graph (a) illustrates threshold voltage distributions of victim memory cells prior to programming of corresponding aggressor cells.

A second graph (b) shows threshold voltage distributions of the memory cells after interference. In other words, graph (b) illustrates threshold voltage distributions of the victim memory cells after programming of the aggressor cells. As indicated by the solid and dotted curves in graph (b), the threshold voltage distributions of the victim cells expand in response to programming of the aggressor cells. This expansion occurs in the direction of the arrows pointing to the right.

A third graph (c) shows threshold voltage distributions of the memory cells after the tuning program procedure. As indicated by the arrows between dotted and solid curves in graph (c), the tuning program procedure narrows the threshold voltage distributions to compensate for the interference.

A fourth graph (d) shows the threshold voltage distributions of the memory cells after the tuning program procedure.

As indicated by a shift between a verify voltage Vfy7 in graph (a), and a verify voltage Vfy7' in graph (d), the threshold voltage distributions in graph (d) are higher than those in graph (a). Accordingly, to allow for this increase, verify voltages in the initial programming of victim cells may be set lower than desired final threshold voltages.

The tuning program procedure can be performed during programming of the aggressor memory cells or it can be performed after programming of the aggressor memory cells. By performing the tuning program procedure, potential errors due to interference such as program disturbances or coupling can be avoided.

Figure 10:
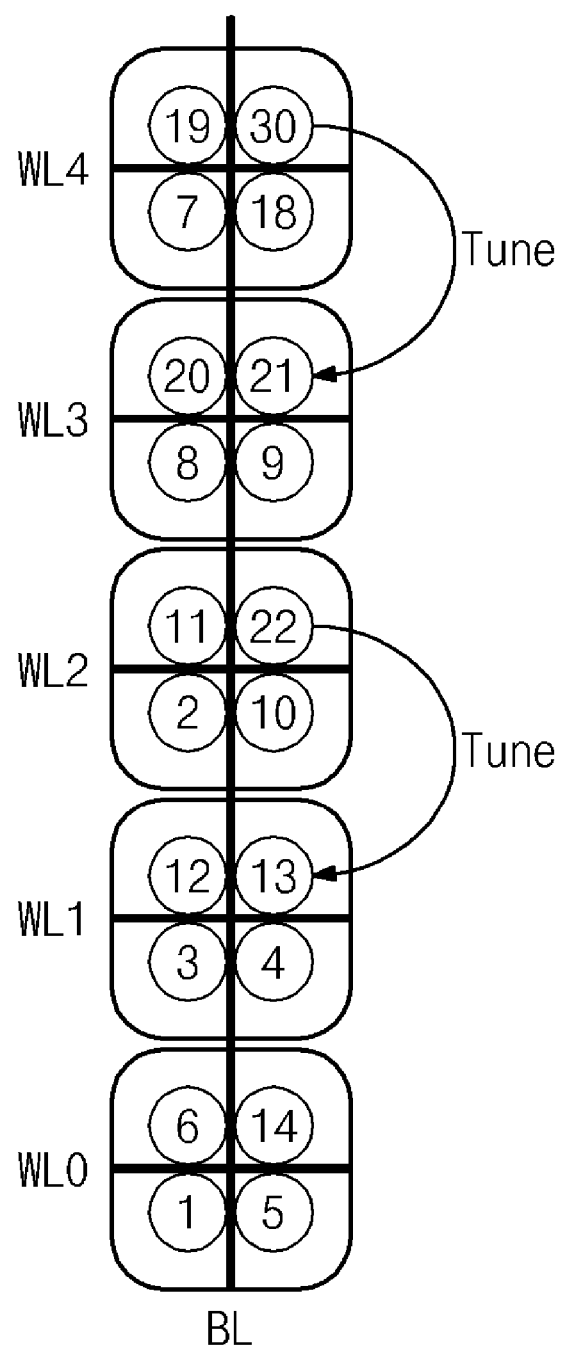
FIG. 10 is a conceptual diagram illustrating another embodiment of a tuning program procedure.

FIG. 10 is a conceptual diagram illustrating another embodiment of a tuning program procedure. In FIG. 10, memory cells are programmed using the programming sequence of group (d) of FIG. 6, and the tuning program procedure is performed on resulting victim memory cells.

The victim memory cells in FIG. 10 are connected to wordlines WL1 and WL3. Interference is produced in the memory cells of wordline WL1 due to programming of a page 22 in aggressor memory cells after programming of a page 13 in victim memory cells. Similarly, interference is produced in the memory cells of wordline WL3 due to programming of a page 30 in aggressor memory cells after programming of a page 21 in victim memory cells.

In the embodiment of FIG. 10, the tuning program procedure is performed on the victim memory cells after programming of the aggressor memory cells via wordlines WL2 and WL4. The tuning program procedure adjusts the threshold voltage distributions of the victim memory cells to compensate for interference caused by the aggressor memory cells.

Although not illustrated in the drawings, the tuning program procedure can be performed in any of the groups shown in FIGS. 3 through 7 to compensate for interference caused by aggressor cells.

Figure 12:
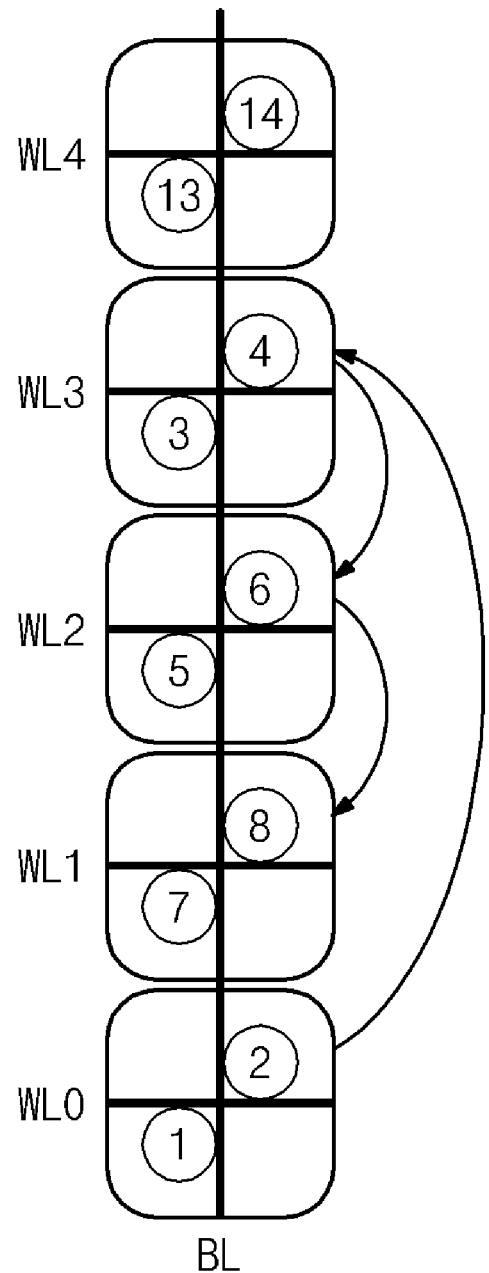
FIG. 12 is a conceptual diagram illustrating an embodiment of a tuning program procedure.

FIG. 11 is a conceptual diagram illustrating a programming method for a nonvolatile memory device according to still another embodiment of the inventive concept, and FIG. 12 is a conceptual diagram illustrating an embodiment of a tuning program procedure.

The embodiment of FIG. 11 represents a variation of certain embodiments described above. In FIG. 11, groups of memory cells (a) through (d) comprising memory cells storing different numbers of bits are programmed using programming sequences indicated by circled numbers.

In a group (a) of FIG. 11, 2-bit memory cells are programmed in the illustrated sequence, resulting in aggressor cells connected to wordlines WL0, WL2, and WL4 due to the programming of MSB pages 5, 9 and 13. Although not illustrated in the drawings, a page 10 is programmed in memory cells connected to a wordline WL6 as LSB data.

In a group (b) of FIG. 11, 3-bit memory cells are programmed in the illustrated sequence, resulting in aggressor cells connected to wordlines WL1 and WL3 due to the programming of MSB pages 13 and 15.

Finally, in a group (c) of FIG. 11, 4-bit memory cells are programmed in the illustrated sequence, resulting in aggressor cells connected to wordlines WL0, WL2, and WL4 due to the programming of MSB pages 30, 22 and 14.

In the embodiment of FIG. 11, some of the programming sequences program successive pages in the same memory cells for a more efficient programming operation. For instance, in group (c), pages 5 and 6 are successively programmed in memory cells connected to wordline WL0, allowing wordline WL0 to remain selected for more efficient programming.

In the embodiment of FIG. 12, pages 1 and 2 are programmed into memory cells connected to wordline WL0 as LSB and MSB data, respectively. Thereafter, pages 3 and 4 are programmed into memory cells connected to wordline WL3 as LSB and MSB data, respectively. Thus, the programming operation of FIG. 12 skips WL1 and WL2, as indicated by a long arrow. Next, pages 5 and 6 are programmed as LSB and MSB data into memory cells connected to wordline WL2, and pages 7 and 8 are programmed as LSB and MSB data into memory cells connected to wordline WL1. The order of these operations is indicated by smaller arrows in FIG. 12. By programming the memory cells in this order, the concentration of interference in the memory cells can be reduced.

Figure 13:
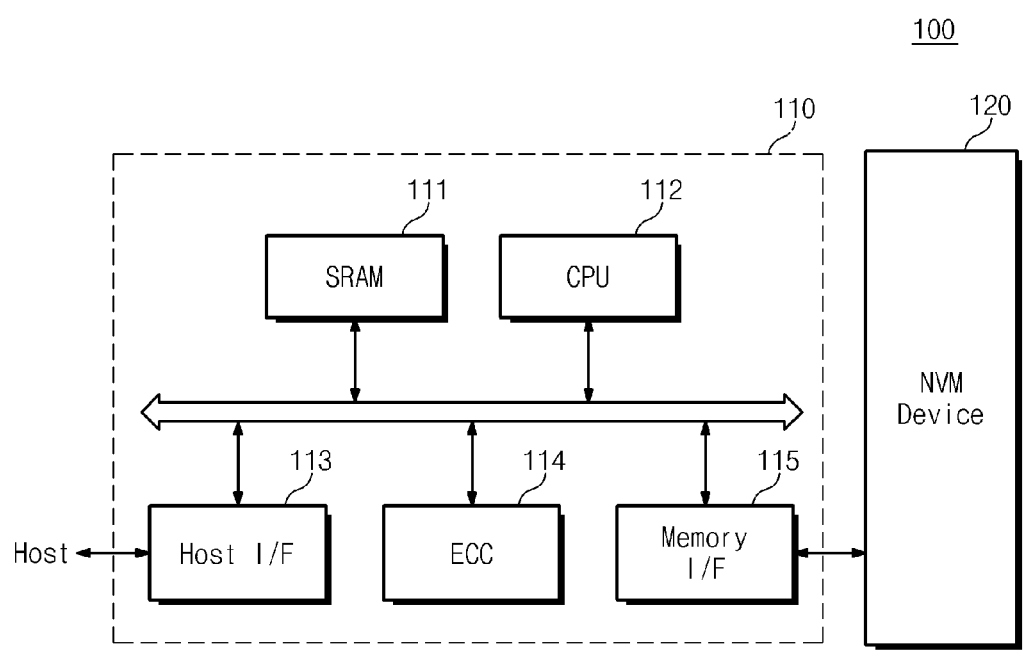
FIG. 13 is a block diagram illustrating a memory system according to an embodiment of the inventive concept.

FIG. 13 is a block diagram illustrating a memory system 100 according an embodiment of inventive concept. Referring to FIG. 13, memory system 100 comprises a nonvolatile memory device 120 and a memory controller 110.

Nonvolatile memory device 120 comprises a flash memory device configured to perform program operations with a programming sequence such as those described above with reference to FIGS. 3 through 12. Memory controller 110 is configured to control nonvolatile memory device 120. In some embodiments, nonvolatile memory device 120 and memory controller 110 can be combined to form a memory card or a solid state disk (SSD).

Memory controller 110 comprises a CPU 112, a static random access memory (SRAM) 111 used as an operating memory for CPU 112, a host interface 113 implementing a data exchange protocol for a host connected to memory system 100, an error correction code (ECC) block 114 for detecting and correcting errors in data read from nonvolatile memory device 120, and a memory interface 114 for interfacing with nonvolatile memory device 120. CPU 112 performs general control operations for exchanging data with memory controller 110. Although not illustrated in the drawings, memory system 100 may further comprise a read only memory (ROM) for storing code data to interface with the host.

In certain embodiments, nonvolatile memory device 120 is implemented as a multi-chip package comprising a plurality of flash memory chips. Moreover, in certain embodiments, memory system 100 can be provided as a high reliability storage medium, i.e., a storage medium with low error probability. In certain embodiments, memory controller 110 can be configured to communicate with an external device, such as a host, using an interface protocol such as universal serial bus (USB), multimedia card (MMC), peripheral component interface express (PCI-E), serial advanced technology attachment (SATA), parallel-ATA (PATA), small computer small interface (SCSI), enhanced small disk interface (ESDI), or integrated drive electronics (IDE).

Figure 14:
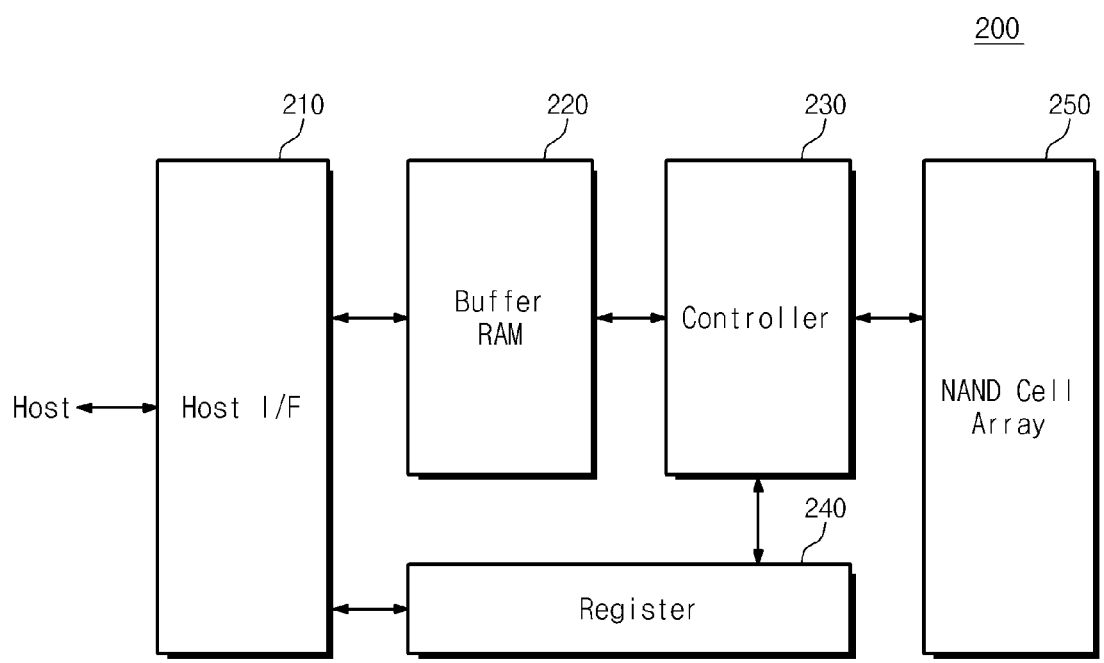
FIG. 14 is a block diagram illustrating a fusion memory device or a fusion memory system that performs a program operation according to certain embodiments of the inventive concept.

FIG. 14 is a block diagram illustrating a fusion memory device or system 200 that performs programming operations using techniques such as those described above with reference to FIGS. 3 through 12. In certain embodiments, fusion memory device or system 200 comprises a oneNAND flash memory device.

Fusion memory device or system 200 comprises a host interface 210 for exchanging information with other devices using any of various protocols, a buffer RAM 220 for storing code to drive a memory device and for temporarily storing data, a controller 230 for controlling read and program operations and overall states of device or system 200 in response to control signals and commands provided from an external source, a register 240 for storing data such as commands, addresses, and configuration information defining a system operating environment, and a NAND flash cell array 250 comprising a nonvolatile memory cell and a page buffer. In response to a write request from a host, fusion memory device or system 200 programs data according to a programming sequence that accounts for potential interference from aggressor cells connected to a specific wordline.

Figure 15:
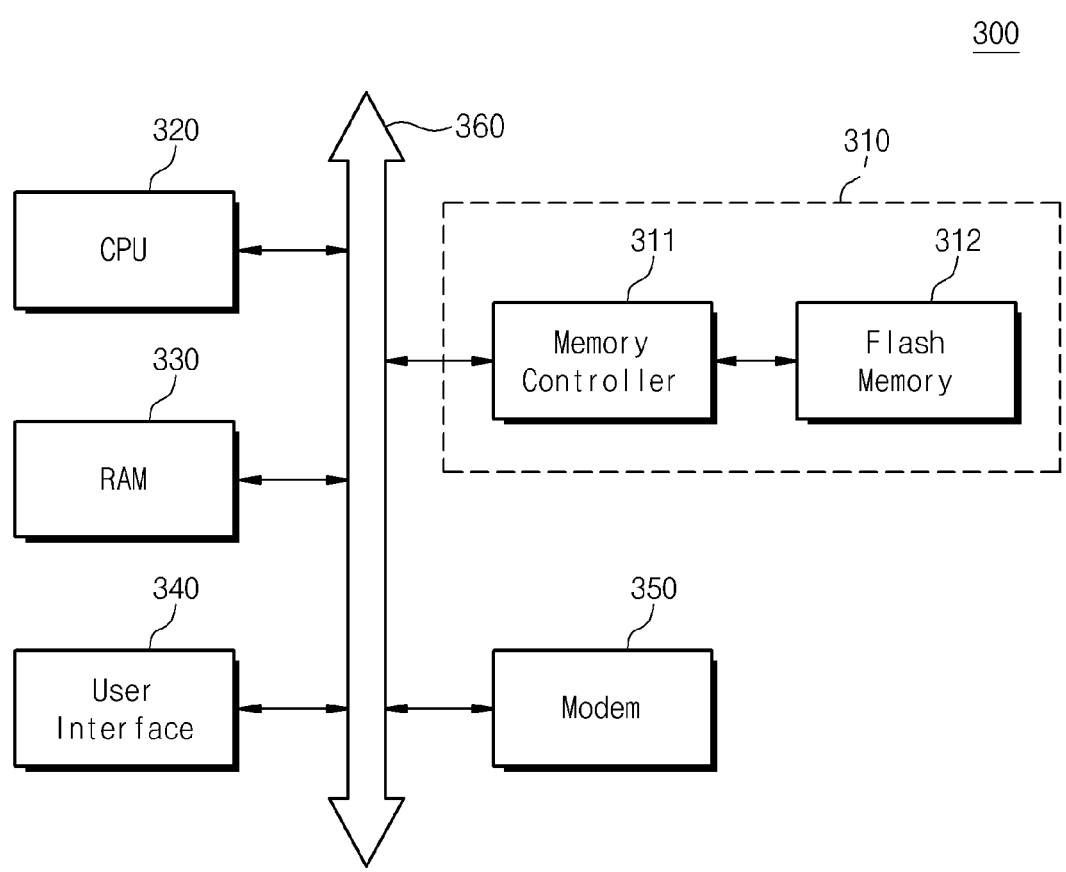
FIG. 15 is a view illustrating a computing system comprising a flash memory device according to certain embodiments of the inventive concept.

FIG. 15 is a block diagram illustrating a computing system 300 comprising a flash memory device 312 according to an embodiment of the inventive concept. Computing system 300 comprises a microprocessor 320 such as a central processing unit (CPU), a random access memory (RAM) 330, a user interface 340, a modem 350 such as a baseband chipset, and a memory system 310, which are electrically connected to a bus 360. Memory system 310 comprises a memory controller 311 and a flash memory 312. Where computing system 300 is a mobile device, a battery (not shown) may be additionally provided to supply an operating voltage.

Although not illustrated in the drawings, memory system 300 may further comprise an application chipset, a camera image processor (CIS), and a mobile DRAM. In some embodiments, memory system 310 forms a solid state disk (SSD) or a fusion flash memory such as a oneNAND flash memory. In certain embodiments, computer system 300 recovers damaged data from victim cells with reference to data stored in aggressor cells.

Rearrangement of programming data is performed in memory system 310 under the control of microprocessor 320. Alternatively, memory system 310 and microprocessor 320 can share the task of data rearrangement.

Flash memory device 312 and/or memory controller 311 can be packaged in any of several different configurations. Examples package configurations for flash memory device 312 and/or memory controller 311 include package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

According to certain embodiments of the inventive concept, a nonvolatile memory device capable of providing reliable data is provided.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a nonvolatile memory device, comprising:
    programming memory cells connected to a first wordline;
    programming memory cells connected to a second wordline;
    programming memory cells connected to a third wordline disposed between the first wordline and the second wordline; and
    adjusting respective threshold voltages of the memory cells connected to the first wordline to compensate for interference caused by the programming of the memory cells connected to the third wordline.

2. The method of claim 1, wherein the third wordline is disposed adjacent to the first wordline and the second wordline.

3. The method of claim 1, wherein adjusting the respective threshold voltages of the memory cells connected to the first wordline is performed during programming of the memory cells connected to the third wordline.

4. The method of claim 1, wherein the nonvolatile memory device is a multi-level cell flash memory device and the memory cells connected to the first and third wordlines store most significant bit (MSB) data following the programming.

5. The method of claim 1, wherein the nonvolatile memory device comprises a NOR flash memory device.

6. The method of claim 1, wherein the nonvolatile memory device is a multi-level cell flash memory device and the memory cells connected to the first wordline are programmed with most significant bit (MSB) data, and the memory cells connected to the third wordlines are programmed with MSB after the memory cells connected to the first wordline.

7. The method of claim 6, wherein the memory cells connected to the first wordline are programmed with least significant bit (LSB) data and the MSB data in successive program operations of the nonvolatile memory device.

8. The method of claim 1, wherein adjusting the respective threshold voltages of the memory cells connected to the first wordline comprises increasing the threshold voltages.

9. A method of programming a multi-level cell nonvolatile memory device, comprising:
    programming a first page of data in memory cells connected to a first wordline of the nonvolatile memory device;
    programming a second page of data in memory cells connected to a second wordline of the nonvolatile memory device; and
    programming a third page of data in memory cells connected to a third wordline of the nonvolatile memory device between the first wordline and the second wordline,
    wherein the third page of data is programmed after the first and second pages of data.

10. The method of claim 9, further comprising adjusting respective threshold voltages of the memory cells connected to the first wordline to compensate for interference produced by the programming of the third page of data.

11. The method of claim 9, further comprising:
    programming a fourth page of data in the memory cells connected to the first wordline;
    programming a fifth page of data in the memory cells connected to the second wordline; and
    programming a sixth page of data in the memory cells connected to the third wordline;
    wherein the fourth through sixth pages of data comprise least significant bit (LSB) data and the first through third pages of data comprise most significant bit (MSB) data.

12. The method of claim 11, wherein the sixth page of data is programmed prior to at least one of the fourth and fifth pages of data.

13. The method of claim 9, wherein the nonvolatile memory device comprises a NOR flash memory device.

14. The method of claim 10, wherein the multi-level cell nonvolatile memory device is a four bit nonvolatile memory device.

15. A method of programming a multi level cell nonvolatile memory device, comprising:
    programming a first page into memory cells connected to a first wordline;

programming a second page into memory cells connected to a second wordline;

programming a third page into memory cells connected to a third wordline between the first wordline and the second wordline, and programming a fourth page into memory cells connected to the third wordline;

wherein the third and fourth pages are programmed in the memory cells connected to the third wordline after the first and second pages are programmed in the memory cells connected to the respective first and second wordlines.

16. The method of claim 15, further comprising programming a fifth page into memory cells connected to the first wordline after programming the fourth page into the memory cells connected to the third wordline.

17. The method of claim 16, wherein the fourth page and the fifth page comprise most significant bit (MSB) data.

18. The method of claim 16, further comprising:

performing a tuning program procedure to adjust threshold voltages of the respective memory cells connected to the third wordline to compensate for interference due to the programming of the fifth page.

19. The method of claim 16, further comprising:

identifying memory cells connected to the first wordline as victim cells prior to the programming of the fifth page, and identifying the memory cells connected to the first wordline as aggressor cells following programming of the fifth page.

20. The method of claim 15, wherein the nonvolatile memory device is a four-level cell NOR flash memory device.

* * * * *